United States Patent [19]

Magee et al.

[11] Patent Number: 4,758,533

[45] Date of Patent: Jul. 19, 1988

[54] LASER PLANARIZATION OF NONREFRACTORY METAL DURING INTEGRATED CIRCUIT FABRICATION

[75] Inventors: Thomas J. Magee, Belmont; John F. Osborne; Peter Gildea, both of Sunnyvale; Charles H. Leung, San Jose, all of Calif.

[73] Assignee: XMR Inc., Santa Clara, Calif.

[21] Appl. No.: 99,792

[22] Filed: Sep. 22, 1987

[51] Int. Cl.⁴ .......................................... H01L 21/268
[52] U.S. Cl. .................................... 437/173; 437/174; 437/188; 437/194; 437/908; 148/DIG. 93; 427/53.1; 219/121.6
[58] Field of Search ............... 437/173, 174, 187, 188, 437/194, 907, 908; 148/DIG. 90, DIG. 91, DIG. 92, DIG. 93; 427/53.1; 219/121 L, 121 LE, 121 LF, 121 LP, 121 LM; 357/67, 71; 156/643

[56] References Cited

U.S. PATENT DOCUMENTS

| 4,258,078 | 3/1981 | Celler et al. | 427/43.1 |
| 4,388,517 | 6/1983 | Schulte et al. | 219/121 LM |
| 4,542,037 | 9/1985 | Delfino | 427/53.1 |
| 4,674,176 | 6/1987 | Tuckerman | 29/591 |

FOREIGN PATENT DOCUMENTS 1104062  5/1986  Japan ................................ 427/53.1

OTHER PUBLICATIONS

Hodgson, R. T., et al, *IBM Tech. Disc. Bull.*, vol. 21, No. 10, Mar. 1979, P. 4286.
Tuckerman, D. B., et al. *IEEE Electron Service Letters*, vol. EDL-7, No. 1, Jan. 1986, pp. 1-4.
Hsu, S. C., et al. *Metallurgical Transactions B*, vol. 9B, Jun. 1978, pp. 221-229.

Primary Examiner—Brian E. Hearn
Assistant Examiner—T. N. Quach
Attorney, Agent, or Firm—William C. Milks, III

[57] ABSTRACT

Nonrefractory micrometer-thick deposited metal or metallization, for example, aluminum and aluminum alloy films, on integrated circuits are planarized by momentarily melting them with optical pulses from a laser, such as a xenon chloride excimer laser. The substrate, as well as any intervening dielectric and conducive layers, are preheated to preferably one-half the melting temperature of the metal to be planarized, thereby enhancing reflow of the metal upon melting. This improves planarization and reduces stress in the resolidified metal. Laser planarization offers an attractive technique for fabricating multilayer interconnect structures, particularly where a number of ground or power planes are included. Excellent step coverage and via filling is achieved without damaging lower layers of interconnect.

7 Claims, 7 Drawing Sheets

LASER PLANARIZATION OF NONREFRACTORY METAL DURING INTEGRATED CIRCUIT FABRICATION

BACKGROUND OF THE INVENTION

This invention relates to integrated circuit manufacture and, more particularly, to fabrication of extremely dense very-large-scale integrated circuit (VLSI) designs typically requiring the use of thin-film planarization procedures to produce reliable multilayer interconnect systems. Specifically, the invention is directed to advances in laser planarization of nonrefractory metal films, such as aluminum films, or nonrefractory metallization layers, during the fabrication of multilayer VLSI circuits.

High-performance, large-area integrated circuits often incorporate several layers of interconnect. Planarization processes which smooth and flatten the surface of an integrated circuit at various stages of fabrication are therefore generally employed. The need is particularly acute in the case of wafer-scale integration (e.g., an efficient, high-power wafer-scale integrated circuit can require two, three, or even four layers of interconnect plus two or more ground or power planes). The most severe topographic problems occur in the vicinity of stacked vias, where a connection extends from one interconnect layer to the next layer.

Multilayer interconnect systems for integrated circuits demand one or more planarization procedures, in order to maintain an acceptably flat topography for high-resolution photolithography and for adequate coverage of steps by thin films on higher layers. Traditional approaches have involved planarization of the interlayer insulation (dielectric) layers by smoothing the dielectric between metal layers, either by spin-on application (e.g., polyimide), or by reflow (e.g., phosphosilicate glass), as well as other techniques. In this regard, one dielectric planarization technique uses a scanning CW $CO_2$ laser to rapidly flow phosphosilicate glass. See Delfino, M., "Phosphosilicate Glass Flow Over Aluminum in Integrated Circuit Devices," I.E.E.E. Elec. Dev. Lett., Vol. EDL-4, No. 3, 1983, pp. 54–56. However, planarization of the insulating layers does not by itself provide a fully planar multilayer interconnect process. Severe stepcoverage problems still occur where metals are deposited over deep vertical vias in an insulator, and this problem is accentuated if vias are vertically stacked. None of these dielectric planarization techniques can planarize a deep vertical or stacked (nested) via, because the dielectric must be removed from the contact area between each layer, resulting in a large thickness deficiency at the via.

Celler, et al., U.S. Pat. No. 4,258,078, disclose using an Nd:YAG laser or electron beam to eliminate sharp features that appear on metallization patterns defined by conventional etching processes, to aid in the exposure of defects in conductor rails, that eventuate in open circuits; to repair filamentary shorts between conductor rails; or, in the case of refractory metals, such as polysilicon, molybdenum, tungsten, etc., to improve conductivity. This patent relates to a process which would apply after the metal was planarized and patterned and to refractory, as opposed to nonrefractory, metals. In any event, the metals used for metallization are melted and quenched in a period so short that surface tension acts on the shape of the metal, but flow does not occur, thereby precluding planarization of the metal.

An alternative approach to achieve planarity in multilayer interconnect systems involves actual planarization of metal layers. One metal planarization process is RF bias sputtering. See Mogami, T., Okabayashi, H., Nagasawa, E., and Morimoto, M., "Planarized Molybdenum Interconnection Using Via-Hole Filling by Bias Sputtering," Proc. 1985 VLSI Multilevel Interconnection Conf. (V-MIC), I.E.E.E. Cat. 85CH2197-2, June, 1985, pp. 17–23. However, this metal planarization process relates to refractory metals.

In contrast, a nonrefractory metal, such as gold or aluminum, can be melted using rapid thermal annealing techniques. The disadvantage of these metal planarization techniques is the length of time that the metal remains molten. Unacceptable metallurgical reactions can be induced in thin films (e.g., molten aluminum reduces an $SiO_2$ dielectric to form silicon and volatile suboxides in a few seconds, and, based on typical thermal diffusivities in molten metals, 1 micrometer of molten gold can completely alloy with a titanium adhesion layer in about 1 ms). This causes device degradation.

Additionally, Tuckerman, D. B., and Schmitt, R. L., "Pulsed Laser Planarization of Metal Films For Multilevel Interconnects," Proc. 1985 VLSI Multilevel Interconnection Conf. (V-MIC), I.E.E.E. Cat. 85CH2197-2, June, 1985, pp. 24–31, disclose that each metal layer can be melted (hence planarized) using a pulsed laser prior to patterning. Planarization of gold films is achieved (less than 0.1 micrometer surface roughness, even starting with extreme topographic variations); and conductivity is also improved. However, for the $Au/SiO_2$ structure disclosed in the article, an adhesion layer, such as Cr, is necessary at every interface between the two materials.

Furthermore, the article discloses planarization of gold films on $SiO_2$ dielectric layers using a linear flashlamp-pumped pulsed dye laser containing a coumarin dye, supplying optical pulses having a wavelength of 504 nm. The pulses have a 1 microsecond duration (full width at half maximum), 150 mJ of energy, and 1 Hz repetition rate. Unfortunately, the authors primarily utilized an unstable dye laser, and there is limited throughput due to the shortcomings of the dye laser.

The article additionally indicates that if the duration of the melt is much longer than 1 microsecond, unacceptable metallurgical reactions can be induced in thin films. A few experiments were performed using a KrF excimer laser (248 nm) as the pulse source, but the 10 ns pulse provided a substantially reduced operating window between melting and damage, compared with the factor-of-two window available with the 1 microsecond pulsed dye laser. High incident optical pulse energies produce large crystal grain sizes, which more closely approach theoretical conductivity. Accordingly, a high energy optical pulse of short duration to reflow the metal would be desirable, since conductivity could be improved, but deleterious metallurgical reactions would still be avoided.

Also, in order that sufficient metal area is molten at one time, the article discloses that the laser beam is focused to a 2 mm diameter spot on the wafer and is used to melt a large area (4 $mm^2$) of metal with a single pulse. However, the theoretical energies needed to be more than doubled to account for the approximately 50% reflectance of the gold and to allow for cold spots in the laser beam. No effort was made to make the spot uniform in intensity, and, consequently, about one-half the pulse energy (around the beam circumference) was below the melt threshold and hence wasted.

Furthermore, the article notes that the metal film should be able to absorb a significant amount of the incident optical power. For this reason, the authors substantially avoided planarizing highly reflective metals, such as aluminum and silver, and instead planarized gold. This is unfortunate because of the wide usage of aluminum in the industry.

In this regard, gold has greater than 50% absorbance in the green or blue region of the spectrum (48% of the energy being reflected by gold films) and has no native oxide. Laser planarization of aluminum films presents a more difficult problem. The high reflectance of aluminum (approximately 92% for visible light) requires high optical pulse energy. Unfortunately, small variations in surface texture, topography, and composition can significantly increase the absorbed power, causing damage. Aluminum's refractory native oxide also presents a serious problem, for it typically remains as a solid skin, impeding planarization.

The article indicates that the wafers were exposed to ambient air during the planarization process. The authors report that no adverse effects appear to be associated with this procedure, and indicate that in the case of aluminum, which oxidizes easily, while there might be reason to operate in an oxygen-free environment, satisfactory results were apparently obtained without doing so.

Nevertheless, at least one of the authors in a later article proposes that one can instead overcoat reflective metal films, such as aluminum, with a thin absorbing layer. See Tuckerman, D. B., and Weisberg, A. H., "Planarization of Gold and Aluminum Thin Films Using a Pulsed Laser," I.E.E.E. Elec. Dev. Lett., Vol. EDL-7, No. 1, January, 1986, pp. 1-4. This article discloses sputter-depositing a thin (<200-Angstrom) layer of amorphous silicon over the aluminum after sputter-etching off the native oxide, which passivates the aluminum against oxide formation prior to laser planarization and also acts as an antireflection coating to increase its initial optical absorbance. While this greatly aids the aluminum planarization process, the requirement of a silicon overcoat to consistently planarize aluminum films complicates the fabrication process. Furthermore, the planarized aluminum films are stressed, which can lead to device failure.

SUMMARY OF THE INVENTION

A laser is used to momentarily melt a deposited nonrefractory metal film or metallization. In accordance with the invention, the substrate is preheated to approximately 50% of the melting temperature of the metal film to be planarized, and submicrosecond pulses are used, in order to minimize the temperature rise in the preheated substrate, reduce the energy required for melting, and minimize undesirable metallurgical reactions.

Accordingly, the invention comprises a method for laser planarization of a given composition and thickness of a nonrefractory metal or metallization layer on a wafer. One embodiment of the method comprises the steps of: applying heat to the wafer from an external source to preheat the wafer to approximately one-half the melting temperature of the metal to be planarized; providing a laser; focusing a laser beam produced by the laser on the metal; irradiating the metal with optical energy to momentarily melt the metal, the laser beam having sufficient energy per square centimeter to momentarily melt the given composition and thickness of the metal, the laser beam having a substantially uniform beam profile of approximately plus or minus 5%; discontinuing irradiation of the metal; and allowing the molten metal to flow until the temperature of the metal falls below the melting temperature and the metal resolidifies. In the case of aluminum, the temperature to which the wafer is preheated is 200 to 400 degrees Celsius. Preferably, the laser is a pulsed xenon chloride (XeCl) excimer laser. The laser beam is preferably repetitively stepped across the surface of the wafer to produce a uniform remelt. This includes controlling the laser pulse repetition rate, pulse energy, amount of overlap between adjacent sites, and the number of pulses per site.

In the case of pure aluminum or aluminum metallizations, the method preferably further comprises the steps of: loading the wafer into a process chamber and evacuating the chamber (to approximately $2 \times 10^{-6}$ mbar) to isolate the wafer from substantial reactive components, such as water vapor, hydrocarbons, oxygen, etc., before preheating the substrate and irradiating the metal; and cooling the wafer to less than 150 degrees Celsius, restoring the chamber to atmospheric pressure, and removing the wafer from the chamber after discontinuing irradiation.

Nonrefractory metals and metallizations can be momentarily melted and effectively planarized over SiO₂ steps, grooves can be filled with the metal, and submicrometer via or contact openings can be filled. Also, it has been found that the metal film is highly stressed in the initial and molten state and that preheating the substrate reduces the stress in the planarized film. The preheated substrate permits the molten metal to flow longer and cool more evenly, thereby resulting in reduced stress in the resolidified planarized film. Accordingly, the invention enables the reduction of hillocks and other stress/strain-related characteristics that can lead to device failure.

The use of a laser to planarize an as-deposited metal film in accordance with the method of the invention overcomes many of the limitations of the alternative planarization techniques. The metal can be planarized over SiO₂ steps, and submicrometer vias can be filled, without resort to spin-on-glass for improved dielectric planarization, or selective tungsten growth for filling submicrometer vias, which involve the use of unproven materials, additional critical process steps, and/or million-dollar-plus equipment. The reduced stress and reproducible crystal grain structure of the planarized films broaden the fabrication process window, thereby increasing yield of VLSI circuits having multilayer interconnect systems.

BRIEF DESCRIPTION OF THE DRAWINGS

The above and other features of the present invention and the concomitant advantages will be better understood and appreciated by those skilled in the art in view of the description of the preferred embodiments given below in conjunction with the accompanying drawings. In the drawings:

FIG. 2, comprising

FIG. 6, comprising

FIG. 8, comprising

DETAILED DESCRIPTION OF THE PREFERRED EMBODIMENTS

Figure 1:
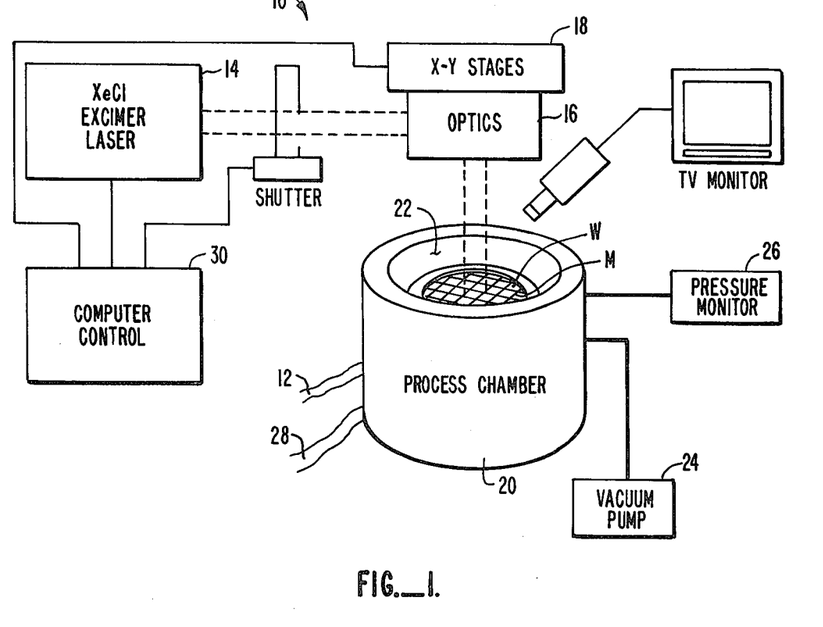
FIG. 1 is a block diagram of an excimer-laser-based nonrefractory metal or metallization planarizing system to perform the method in accordance with the invention.

FIG. 1 shows a block diagram of a laser-based nonrefractory metal or metallization planarizing system, generally indicated by the numeral 10. The planarizing system 10 comprises a heat source 12 for preheating a wafer W to a temperature approximately one-half the melting temperature of metal M on the wafer to be planarized.

The planarizing system 10 also comprises a source 14 of optical energy, for example, a laser, such as a highly stable pulsed xenon chloride (XeCl) excimer laser. For example, the laser can be a Model XC-150 300 mJ, 150 W XeCl excimer laser available from XMR, Inc., located in Santa Clara, Calif., and as described in U.S. Pat. No. 4,611,327, entitled "Gas Transport Laser System," assigned to Standard Oil Company (Indiana), now Amoco Corporation, Chicago, Ill. This laser emits light having a wavelength of 308 nm.

Figure 2A:
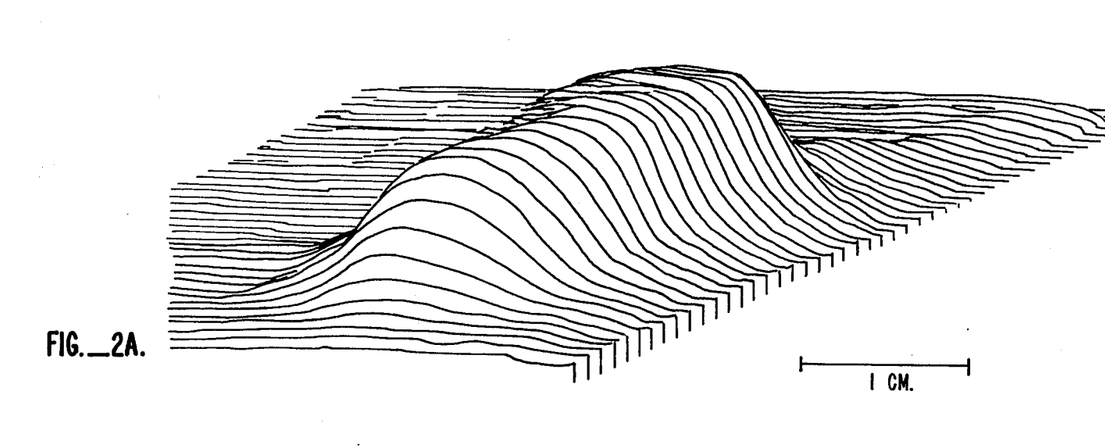
FIGS. 2A and 2B, shows plots of an excimer laser beam before (FIG. 2A) and after (FIG. 2B) being homogenized to a uniformity of approximately plus or minus 5%.
Figure 2B:
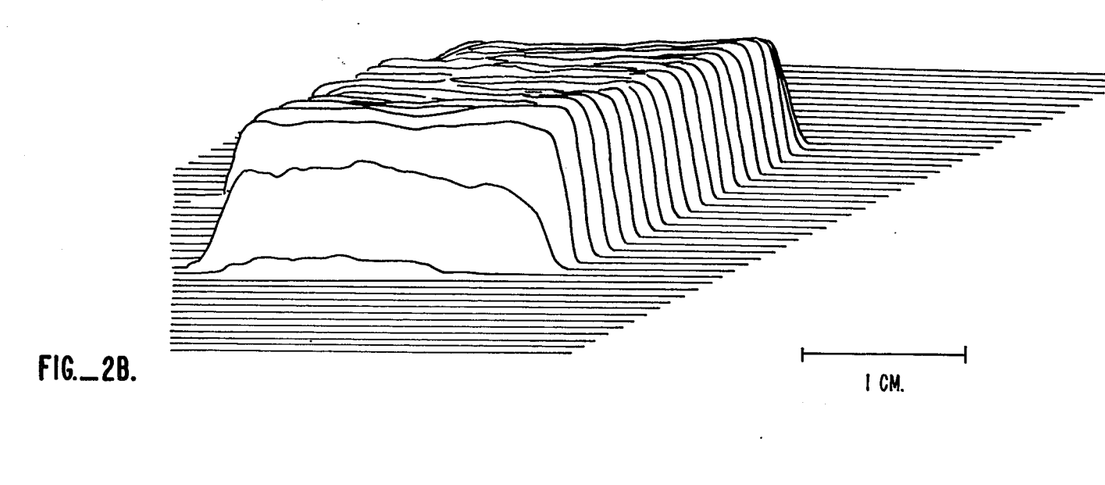

The planarizing system 10 preferably irradiates the metal to be planarized with a uniform laser beam. Accordingly, the planarizing system 10 further comprises optics 16 comprising a homogenizer which converts the laser beam from a quasi-gaussian form, as shown in FIG. 2A, to a "top hat" form, as shown in FIG. 2B. The laser beam is preferably passed through an optical beam integration system, for example, as described in copending U.S. Ser. No. 822,363, filed on Jan. 24, 1986, and assigned to XMR, Inc., in order to provide a uniform beam which is also preferably perpendicular to the irradiated wafer surface. This optical beam integrator produces a beam having a uniformity better than plus or minus 5% across the laser beam, virtually eliminating cold spots in the beam. Advantageously, the above-mentioned optical beam integration system also enables the laser beam dimensions to be adjusted along the X- and Y-axes to form a square or rectangular pattern.

As shown in FIG. 1, the planarizing system 10 also comprises X-Y translation stages 18 configured with stepping motors to translate the optics 16 between pulses. The wafer is held stationary while the portion of the optics 16 directly over the wafer moves on an X-Y track. Maintaining the wafer stationary minimizes the risk of particulate contamination during the planarization process.

If the metal to be planarized is aluminum, or another metal which oxidizes on exposure to ambient air, the wafer is preferably positioned inside a small process chamber 20 covered by a quartz window 22. The planarizing system 10 further comprises a vacuum pump 24 for evacuating the process chamber 20 to a vacuum greater than $10^{-5}$ mbar, as measured by a pressure monitor 26. This buffers the wafer from water vapor, hydrocarbons, oxygen, and other substantial reactive components to prevent surface oxidation. For example, planarizing aluminum in the process chamber 20 avoids formation of Al$_2$O$_3$ when the aluminum is in the molten state. The process chamber 20, and hence the wafer, are preferably maintained stationary to minimize the risk of particulate contamination during the planarization process.

In the case of a nonrefractory metal or metallization layer which is subject to oxidation, the planarizing system 10 also comprises a cooling source 28 for lowering the temperature of the wafer in the process chamber 20. The cooling source 28 can be, for example, a liquid nitrogen injection system. After the metal is momentarily melted and flows to effect planarization, the metal is cooled to a temperature sufficiently low to avoid reaction upon re-exposure to ambient air.

The entire planarization process can be automated. The planarizing system 10 can further comprise a computer control 30, for example, an IBM PC, for controlling both laser functions and wafer processing.

Figure 3:
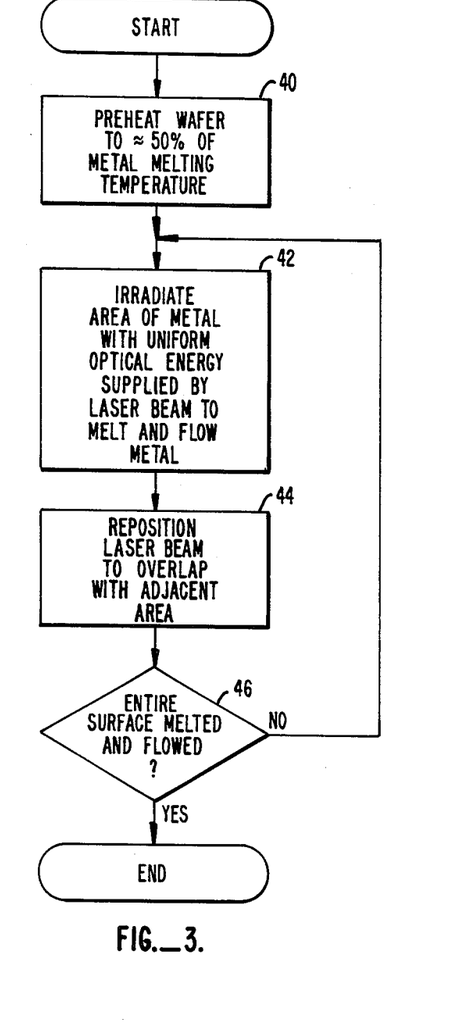
FIG. 3 is a flow chart of one embodiment of the nonrefractory metal or metallization planarizing method in accordance with the invention.

In accordance with the nonrefractory metal or metallization planarizing method of the invention, as shown in FIG. 3, the substrate of the wafer is preheated to approximately 50% of the melting temperature of the metal to be planarized, as indicated by the numeral 40. This increases the width of the process window between planarization and ablation. In the case of aluminum, at 300 degrees Celsius, the process window is approximately 2.0 times the process window at room temperature. Also, thermal energy is stored in the substrate, and, hence, the cooling time is longer, which allows more opportunity for grain growth before the temperature drops below the melting temperature. This reduces stress in the planarized film and improves conductivity.

By way of example, the melting temperature ($T_{melt}$) of aluminum is 660 degrees Celsius. In accordance with the embodiment of the invention for planarizing aluminum, the range of the substrate temperatures is 200 to 350 degrees Celsius.

Generally, planarization of molten metal films is a rapid process, owing to the very high surface tension (about 50 times that of water) and relatively low viscosity (comparable to water) of uncontaminated liquid metals. Additionally, molten metals have a very high thermal diffusivity (1 cm$^2$/s). Accordingly, heat is transferred through a 1 micrometer thick metal film in approximately 10 ns. In contrast, dielectric films, such as amorphous SiO$_2$, have thermal diffusivities approximately 100 times higher than those of molten metal films, such as aluminum. Consequently, the SiO$_2$ layer acts as a thermal barrier to prevent significant heat transfer to the underlying substrate. In view of the high surface tension and thermal diffusivity, and low viscosity, of molten metal, such as aluminum, coupled with the relatively low thermal diffusivity of SiO$_2$, a short, high-energy thermal input to the aluminum film can reflow, and hence planarize, the film without damage to the substrate.

Figure 4:
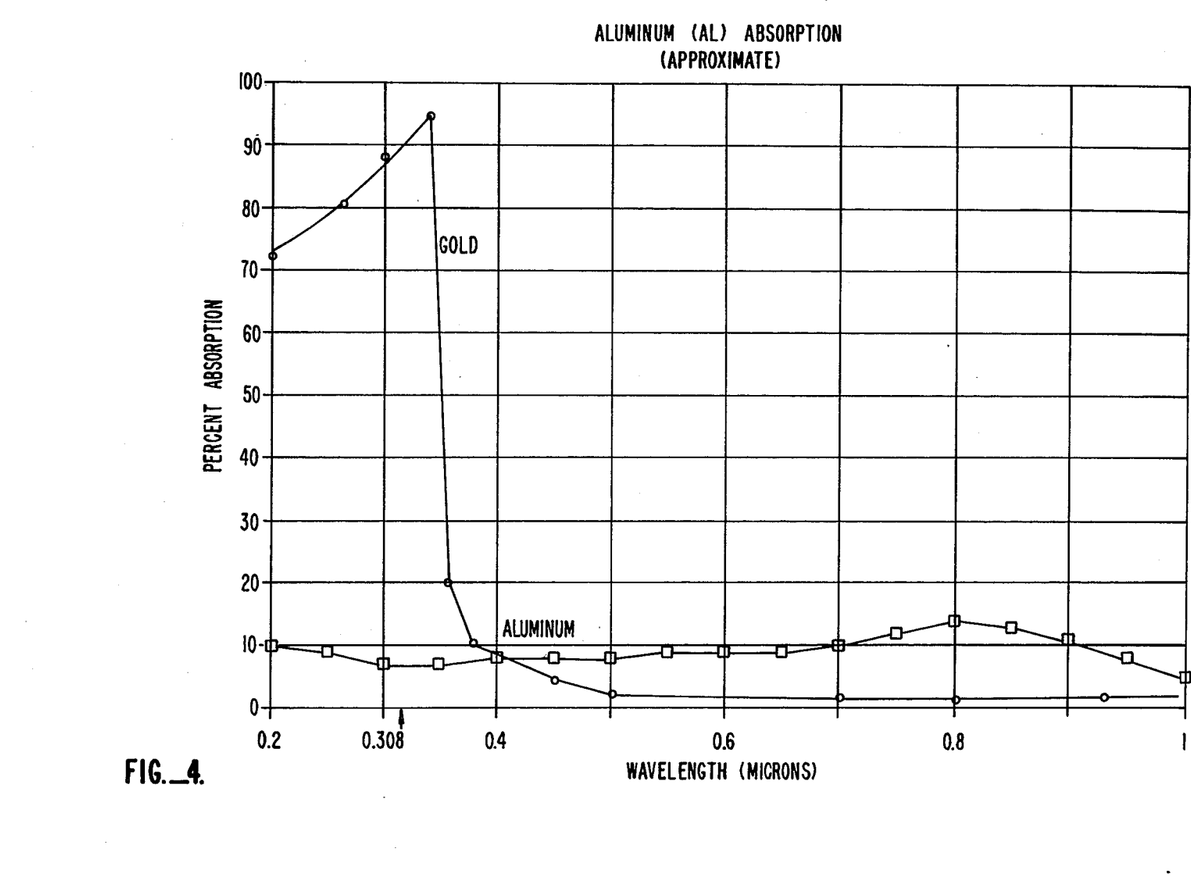
FIG. 4 is a graph of energy absorption of aluminum as a function of optical wavelength.

Preferably, the metal film is planarized by momentarily melting it with a laser beam, as indicated by the numeral 42. As shown in FIG. 4, aluminum absorbs only a small portion of the photon energy received on the surface. The range of absorbability is from 7 to 10% for uncoated aluminum films. The low coupling coefficient of aluminum films necessitates the use of a relatively high power laser. Accordingly, the laser beam can be, for example, 308 nm, 50 ns excimer laser pulses having typical pulse energies of approximately 150 mJ at a 250 Hz repetition rate. Energy densities to cause melting of a 1 micrometer thick aluminum film range from 4 to 6 J/cm$^2$ with the energy density over the laser beam profile within plus or minus 5%.

The optical absorption depth in aluminum is so short (200 Angstroms at typical wavelengths) that the heat can be considered to be generated at the surface of the metal film. The heat diffuses a depth $z=(at)^{\frac{1}{2}}$ in time t, where a is the thermal diffusivity of the metal (e.g., 1.0 cm$^2$/s at 700 degrees Celsius for aluminum). It therefore requires only 10 ns for most of the heat to penetrate through a micrometer of aluminum.

A pulse duration of approximately 50 ns (full width at half maximum) is preferably employed, as measured with a photodiode detector and was repeatable plus or minus 5% from shot to shot. This is useful for two reasons: the underlying layers are exposed to much lower temperatures than is the surface, and the pulse energy required to achieve complete melting is minimized. Short (50 ns) pulses are used to preclude undesirable metallurgical reactions between the film, adhesion or barrier layer (if any), and dielectric layer. The 50 ns pulse duration also allows the heat pulse to uniformly penetrate the aluminum while not penetrating substantially through the underlying SiO$_2$ layer (hence not perturbing the lower layers of metal). If the pulse duration is measurably longer than 50 ns, the molten aluminum can react with the underlying SiO$_2$ or silicon, and degradation of the integrated circuit results.

Submicrosecond pulses, such as the preferred 50 ns pulses, are especially desirable, because underlying layers which reside substantially more than a thermal diffusion length $(at)^{\frac{1}{2}}$ below the surface remain well below their melting points and consequently are heated or diffuse negligibly during the brief heat pulse. However, a pulse shorter than 10 ns would not be useful, because large thermal gradients would be generated in the metal film layer, vaporizing the surface before the bottom of the film reaches the melting point.

The laser planarization process in accordance with the present invention has a large operating window for pulse durations of 50 ns. Energies can typically be increased by a factor of two above the minimum values without significant film vaporization or damage.

Tests were performed to determine the minimum absorbed energy needed to melt 1 micrometer of aluminum on top of a 1 micrometer thick SiO$_2$ layer on a silicon wafer. The energy requirements range from 4 J/cm$^2$ at a 10 ns pulse duration, rising gradually to 6 J/cm$^2$ for a 1 microsecond pulse, and thereafter increasing approximately as the square root of the pulse duration (due to heat penetration into the silicon substrate). Pulse energies were measured with a pyroelectric detector and were repeatable plus or minus 5% from shot to shot. These energies are minimums and lie somewhere between 100% and 200% of the theoretical values, the preheating of the substrate and the absence of cold spots (due to optical integration of the laser beam) serving to reduce the amount of optical energy required, but the reflectance of the metal film counteracting the benefits of the preheating. Preferably, approximately 5 J/cm$^2$ of optical energy is used to melt a 1 micrometer thick aluminum film over a SiO$_2$ layer.

The excimer laser operates in a pulsed mode. This enables the desired surface to be planarized by employing a step-and-repeat motion with desired overlap, as indicated by the numerals 44 and 46.

Large areas are planarized by laterally translating the optics 16 between pulses, so as to expose every point on the surface to at least one optical pulse. The area irradiated by the laser pulse ranges from 4 mm$^2$ to 16 mm$^2$. Preferably, the pulsed laser melts a square area of 9 mm$^2$ with each laser pulse.

The irradiation pattern is preferably square or rectangular. This facilitates control of overlap.

The overlap is greater than zero to avoid discontinuities and is preferably in the range of 50 to 95%. The percentage of overlap needed to produce optimum planarization depends in part on the intrinsic characteristics of the nonrefractory metal or metallization being planarized.

Figure 5:
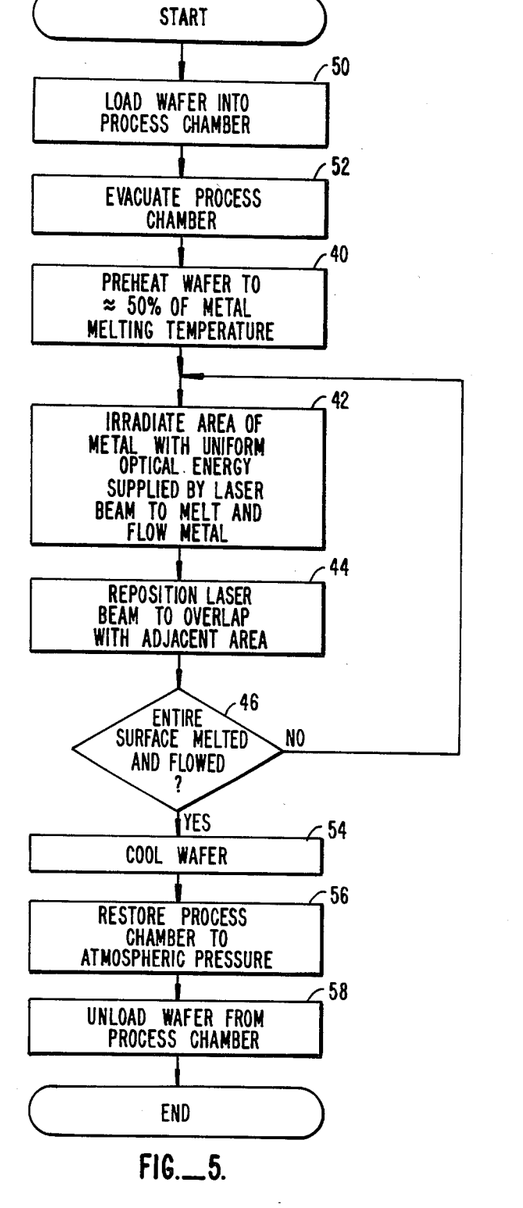
FIG. 5 is a flow chart of an alternative embodiment of the nonrefractory metal or metallization planarizing method in accordance with the invention adapted for use with metals or metallizations prone to oxidation.

Referring to FIG. 5, in accordance with an embodiment of the invention for planarizing aluminum or other nonrefractory metal or metallization subject to oxidation, the wafer is initially loaded into the process chamber 20, as indicated by the numeral 50. A vacuum greater than $10^{-3}$ mbar is then provided, as indicated by the numeral 52. The process chamber 20 is preferably evacuated to $2\times10^{-6}$ mbar. The steps 40, 42, 44, and 46 described above in conjunction with FIG. 3 are next performed.

After the metal is momentarily melted and flows to effect planarization, the metal is then cooled to a temperature sufficiently low to avoid reaction upon reexposure to ambient air, as indicated by the numeral 54. Preferably, the wafer is cooled to 75 to 150 degrees Celsius by introducing nitrogen into the process chamber 20 to control cooling. Thereafter, the process chamber 20 is restored to atmospheric pressure, as indicated by the numeral 56. Finally, as indicated by the numeral 58, the wafer is unloaded from the process chamber 20.

EXAMPLE 1

The planarization samples comprise approximately 1 micrometer thick pure aluminum films deposited over 1500 Angstroms of Ti$_{0.1}$W$_{0.9}$. The aluminum films are deposited by planar magnetron sputtering over test structures covered with approximately 700 Angstroms of SiO$_2$. The test structures have both SiO$_2$ steps and via patterns with geometries ranging from 4 micrometer pitches on SiO$_2$ steps down to 700 Angstroms on via openings. The pulse energy fluence was approximately 5 J/cm$^2$. Typically, the pulses were spaced 0.1 mm apart, which provides an overlap of 99%. The excimer laser pulse repetition rate was 150 Hz. This high repetition rate enables the surface of a six-inch wafer to be stepped in approximately 20 seconds. With the additional time needed for loading and unloading wafers through a vacuum interlock system, 60–80 six-inch wafers can be processed per hour.

Figure 6A:
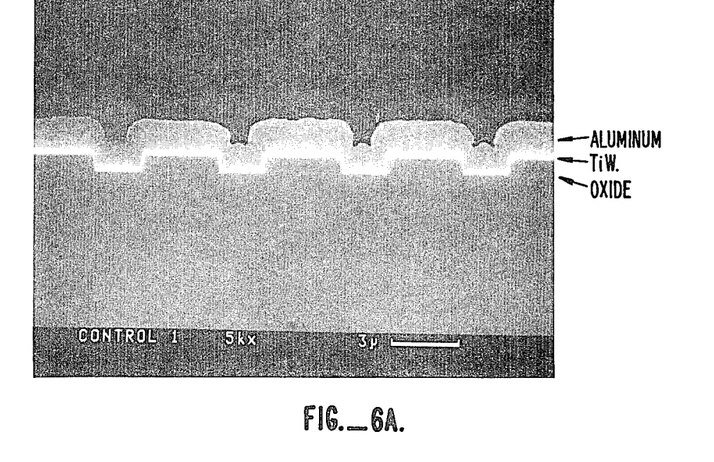
FIGS. 6A and 6B, shows results of pure aluminum thin film planarization employing a 308 nm, 50 ns pulse with 4 J/cm$^2$ fluence.
Figure 6B:
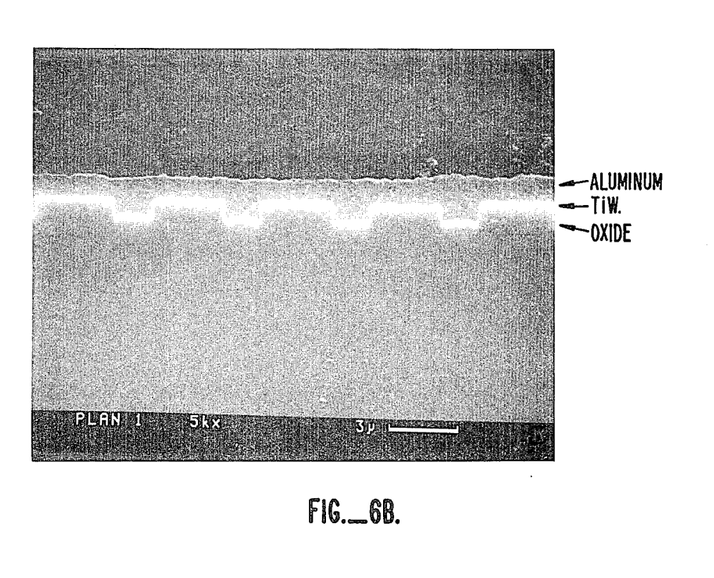

As shown in FIG. 6A, hot planar magnetron sputtering can produce uniform covering over shallow SiO$_2$ steps. The thinning of the metal at the edge of the SiO$_2$ step is accentuated by lower deposition temperatures, higher steps, or narrower geometries. The metal film shown in FIG. 6A was momentarily melted using a 308 nm XeCl excimer laser. In less than 50 ns, the aluminum reflowed to yield the topology as shown in FIG. 6B. The resulting resolidified film is planar to plus or minus 400 Angstroms. There is no evidence of reaction with the $Ti_{0.1}W_{0.9}$ underlayer.

As shown in FIG. 6B, crystal grain size typically increased from 0.2–0.5 micrometer to 1–3 micrometers. The sheet resistance of the films following laser planarization, as determined by four-point probing, is found to be approximately 10% lower than before planarization due to the larger crystal grain size, which reduces electronic scattering.

More importantly, there is also a significant improvement in the stress/strain characteristics of the planarized vis-a-vis the nonplanarized film. One indication of this change is the increase in crystal grain size of the planarized versus nonplanarized film. The laser planarization process reduces the stress that causes hillock growth. Planarized films subjected to a 435 degree Celsius $N_2$ cycle for 12 minutes displayed little evidence of hillocks growth vis-a-vis a nonplanarized control.

EXAMPLE 2

Figure 7:
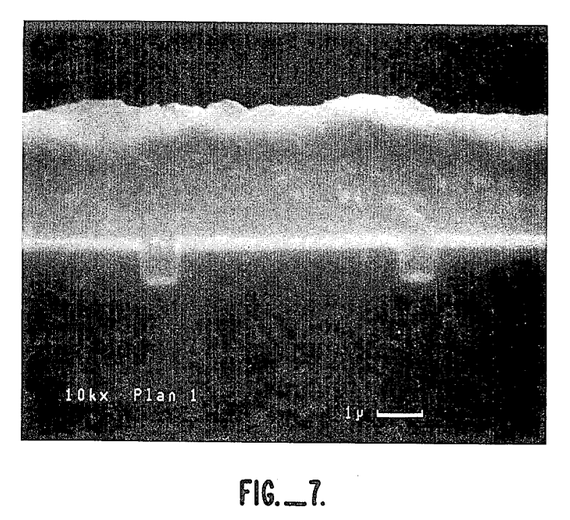
FIG. 7 shows results of planarization of a pure aluminum thin film over submicrometer contacts.

As shown in FIG. 7, submicrometer contacts are filled with reflowed aluminum. The sample comprises 0.7 micrometer×0.7 micrometer contacts with slightly sloped sidewalls approximately 0.8 micrometer deep. As in the case of the example above, the deposited metal structure was 1500 Angstroms of $Ti_{0.1}W_{0.9}$ covered by planar-magnetron-deposited pure aluminum. The film was subjected to multiple pulses of 308 nm light to achieve uniform planarization over a wide area. As shown in FIG. 7, the reflowed aluminum uniformly fills in the contact openings.

EXAMPLE 3

Figure 8A:
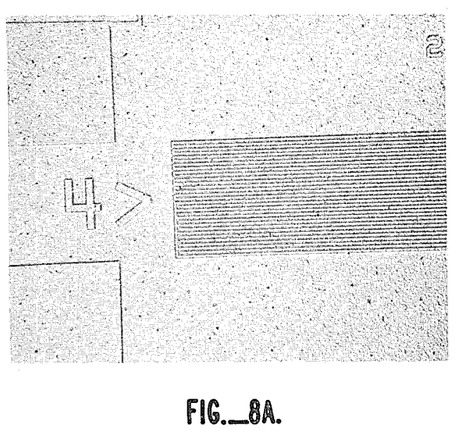
FIGS. 8A and 8B, shows a pure aluminum thin film over a series of SiO$_2$ steps before (FIG. 8A) and after (FIG. 8B) planarization.
Figure 8B:
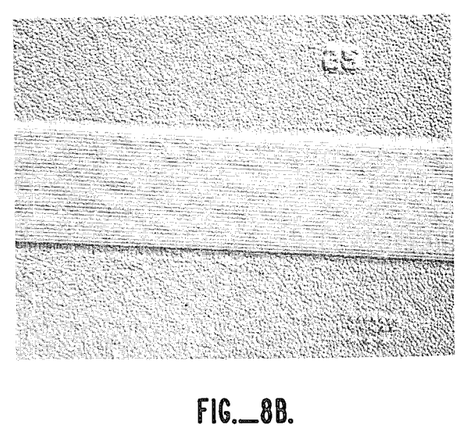

FIG. 8 is a top view of 4 micrometer wide, 1 micrometer thick aluminum lines on 4 micrometer centers, coated with 0.7 micrometer $SiO_2$ and then a 1 micrometer aluminum ground plane, before (FIG. 8A) and after (FIG. 8B) laser planarization. The pulse energy fluence was approximately 5 $J/cm^2$. The molten films planarize very rapidly (less than 50 ns) and exhibit a decrease in surface variation to plus or minus 400 Angstroms. Excellent planarization of the aluminum films is achieved (less than 0.1 micrometer surface roughness, even starting with extreme topographic variations), as well as excellent step coverage. Conductivity is also improved.

Chemical vapor deposition and sputtering processes used to deposit the $SiO_2$ and thin metal film can produce extreme step coverage problems, yet the metal planarized in accordance with the invention is smooth and flat to better than plus or minus 500 Angstroms. No change in average thickness of the films is observed at normal power levels. Thus, there is no significant vaporization of the films during planarization, even when the same area is pulsed repetitively in order to provide the preferred overlap. The average crystal grain size of the aluminum films increased substantially as a result of laser planarization, from about 0.2 micrometer as-deposited to approximately 4 micrometers after laser planarization. Given the rapidity of the planarization of molten metal and the high repetition rate of the excimer laser (250 Hz), the commercial throughput of the process is excellent. For example, data indicate that it is reasonable to scan a four-inch wafer in seven seconds.

Tuckerman, et al., report that the problem with highly reflective metals is not the energy requirement, since the incident flux can simply be increased; rather, it is the fact that when reflectivity is near unity, then seemingly small changes in surface texture, topography, and composition can radically alter the absorbed power. This can lead to instabilities, in which excess absorbed heat modifies the surface in such a way as to further reduce the reflectance, causing still more optical absorption, until the film is vaporized.

The use of substrate preheating reduces the amount of fluence required to planarize the metal film. Since less incident flux is requred to planarize a film at 300 degrees Celsius than at room temperature (25 degrees Celsius), the small changes in surface texture and topography have much less proportional effect. At room temperature there is approximately a 20% window of incident optical energy between melting versus vaporizing the film. By preheating the substrate to 300 degrees Celsius, this window increases to 40%. The preheated substrate also permits the molten metal to flow longer and cool more evenly, thereby resulting in less stress in the resolidified planarized film. Accordingly, the invention enables the reduction of hillocks, as well as the reflow of aluminum over oxide steps and into submicrometer vias. Also, stress-related topographic features, such as hillocks, are essentially eliminated, as the melted films exhibit a substantially reduced tendency to regrow hillocks. Furthermore, regions of single crystal aluminum are obtained, the size and shape of which are dependent upon the substrate temperature at the time of planarization, the amount of energy per $cm^2$ incident on the surface over a given time, and the underlying topography (for example, planarization of metal over a regularly spaced opening in a $SiO_2$ layer produces individual grains with a common orientation having a related aspect ratio).

The dielectric must be capable of withstanding high temperatures (e.g., $SiO_2$), whereas the planarized metal has a moderate melting point (e.g., gold or aluminum). Advantageously, planarization of metals seems more attractive because refractory dielectrics tend to be of higher quality (e.g., fewer pinholes, greater dielectric strength, and higher reliability). Also, the deposited dielectric layers must have low inertial stress to avoid rupture during the laser planarization process. Furthermore, in multilayer interconnect structures, the molten metal must wet the dielectric; this typically occurs if the solid metal has good adhesion to the underlying dielectric. Aluminum films deposited directly onto $SiO_2$ adhere in the solid phase and wet well in the liquid phase. In addition to having good adhesion, the metal film should be able to absorb a significant amount of the incident optical power.

Laser planarization of aluminum films can significantly broaden the fabrication process window. Abrupt $SiO_2$ steps can be uniformly covered with planarized metal. In addition, the reduced stress of the planarized films results in lower hillock densities. Finally, the laser melt of nonrefractory metal films is an effective alternative to chemical vapor deposition of refractory metals for filling submicrometer vias.

Laser planarization of metals is particularly well-suited to multilayer interconnect systems which include ground or power planes. A multilayer interconnect process which uses both the laser planarization of metal and also a compatible dielectric planarization process can be combined to obtain a fully planar interconnect structure.

Although the embodiments of the invention have been described in connection with planarization of thin film metal (i.e., 1 micrometer), the method in accordance with the invention can be applied to planarization of thick films as well. In fact, thicker metal films flow much more easily. Tuckerman, et al., demonstrate that the difficulty of planarization (i.e., melt time required) varies as $h^{-3}$, where h is the metal film thickness. The chemical etching properties of the metal film appear unaffected by the laser planarization process.

While the above description has focused on the use of pure aluminum, the method in accordance with the invention applies equally well to aluminum alloys, such as 1% Cu in aluminum, 0.5% Ti in aluminum, and metallizations, such as 1% Si in aluminum. Although the laser planarization process in accordance with the invention has been described in connection with aluminum, the process is equally applicable to gold planarization. $T_{melt}$ of gold is 1064 degrees Celsius, and, consequently, the temperature to which the substrate is preheated is approximately 530 degrees Celsius. In fact, the only difference between the use of gold and aluminum is that an adhesion layer consisting typically of Cr, Nb, or $Ti_{0.1}W_{0.9}$ is interleaved between each layer of dielectric and gold metal film. The diffusion of the adhesion layer into the gold layer while the gold is molten is negligible, and the impurity levels are not considered significant for multilayer interconnect purposes.

Several embodiments of the planarization method in accordance with the invention have been described by way of example and not by way of limitation. Various modifications will occur to those skilled in the art without departing from the spirit of the invention. Accordingly, the scope of the invention can be ascertained only by reference to the appended claims.

What is claimed is:

1. A method for laser planarization of a given composition and thickness of a nonrefractory metal or metallization layer on a wafer, comprising the steps of:

applying heat to the wafer from an external source to preheat the wafer to approximately one-half the melting temperature of the metal to be planarized;

providing a laser;

focusing a laser beam produced by the laser on the metal;

irradiating the metal with optical energy to momentarily melt the metal, the laser beam having sufficient energy per square centimeter to momentarily melt the given composition and thickness of the metal, the laser beam having a substantially uniform beam profile of approximately plus or minus 5%;

discontinuing irradiation of the metal; and allowing the molten metal to flow until the temperature of the metal falls below the melting temperature and the metal resolidifies.

2. The method of claim 1 wherein the laser beam is repetitively stepped across the surface of the wafer to produce a uniform remelt.

3. The method of claim 2 wherein repetitively stepping the laser beam comprises controlling the laser pulse repetition rate, pulse energy, amount of overlap between adjacent sites, and the number of pulses per site.

4. The method of claim 1 wherein the metal is pure aluminum or aluminum alloy metallization, the method further comprising the steps of:

loading the wafer into a process chamber; and evacuating the chamber to isolate the wafer from substantial reactive components, including water vapor, hydrocarbons, and oxygen, before irradiating the metal; and cooling the wafer to less than 150 degrees Celsius, restoring the chamber to atmospheric pressure, and removing the wafer from the chamber after discontinuing irradiation.

5. The method of claim 4 wherein the temperature to which the wafer is preheated is 200 to 350 degrees Celsius.

6. The method of claim 4 wherein the process chamber is evacuated to approximately $2 \times 10^{-6}$ mbar.

7. The method of claim 4 wherein approximately 5 $J/cm^2$ of optical energy is used to melt a 1 micrometer thick aluminum film.

* * * * *